(12) United States Patent
Yoo et al.

(10) Patent No.: US 8,486,827 B2
(45) Date of Patent: Jul. 16, 2013

(54) DEVICE OF FILLING METAL IN THROUGH-VIA-HOLE OF SEMICONDUCTOR WAFER AND METHOD USING THE SAME

(75) Inventors: Se Hoon Yoo, Incheon (KR); Chang Woo Lee, Anyang-si (KR); Jun Ki Kim, Gunpo-si (KR); Jeong Han Kim, Seoul (KR); Cheol Hee Kim, Incheon (KR); Young Ki Ko, Incheon (KR); Yue Seon Shin, Seoul (KR)

(73) Assignee: Korea Institute of Industrial Technology, Cheonan-si, Chungnam (KR)

( * ) Notice: Subject to any disclaimer, the term of this patent is extended or adjusted under 35 U.S.C. 154(b) by 28 days.

(21) Appl. No.: 13/262,293

(22) PCT Filed: Dec. 30, 2009

(86) PCT No.: PCT/KR2009/007983
§ 371 (c)(1),
(2), (4) Date: Sep. 30, 2011

(87) PCT Pub. No.: WO2010/114216
PCT Pub. Date: Oct. 7, 2010

(65) Prior Publication Data
US 2012/0034776 A1 Feb. 9, 2012

(30) Foreign Application Priority Data
Apr. 3, 2009 (KR) ........................ 10-2009-0029081

(51) Int. Cl.
*H01L 21/768* (2006.01)
(52) U.S. Cl.
USPC .... 438/660; 219/76.1; 438/667; 257/E21.586

(58) Field of Classification Search
USPC ... 118/213; 425/113, 406, 417, 110; 101/126, 101/129, 114, 115
See application file for complete search history.

(56) References Cited

U.S. PATENT DOCUMENTS

| 5,527,561 | A  | * | 6/1996 | Dobson ......................... 427/124 |
| 6,722,624 | B1 | * | 4/2004 | Watson et al. .................. 251/78 |
| 7,513,954 | B2 | * | 4/2009 | Iizuka et al. .................. 118/728 |
| 2009/0087932 | A1 | * | 4/2009 | Kondoh .......................... 438/30 |
| 2010/0144120 | A1 | * | 6/2010 | Segawa et al. ................ 438/464 |

FOREIGN PATENT DOCUMENTS

| JP | 08-078802 | 3/1996 |
| JP | 2002-158191 | 5/2002 |
| JP | 2004-228135 | 8/2004 |
| KR | 10-2008-0068334 | 7/2008 |

* cited by examiner

*Primary Examiner* — Telly Green
*Assistant Examiner* — Damian A Hillman
(74) *Attorney, Agent, or Firm* — Sherr & Jiang, PLLC

(57) ABSTRACT

A device of filling metal in a through-via-hole formed in a semiconductor wafer and a method of filling metal in a through-via-hole using the same are disclosed. A device of filling metal in a through-via-hole formed in a semiconductor wafer includes a jig base comprising a jig configured to fix the wafer having the through-via-hole formed therein; a upper chamber 120 installed on the jig base; a lower chamber installed under the jig base; a heater installed in the upper chamber, the heater configured to apply heat to filling metal placed on the wafer to melt the filling metal; and a vacuum pump configured to generate pressure difference between the upper chamber and the lower chamber by the pressure of the lower chamber reduced by discharging air of the lower chamber 130 outside, only to fill the melted filling metal in the through-via-hole.

6 Claims, 2 Drawing Sheets

DEVICE OF FILLING METAL IN THROUGH-VIA-HOLE OF SEMICONDUCTOR WAFER AND METHOD USING THE SAME

CROSS REFERENCE TO PRIOR APPLICATIONS

This application is a national stage patent application of PCT International Patent Application No. PCT/KR2009/007983 (filed on Dec. 30, 2009) under 35 U.S.C. §371, which claims priority to Korean patent Application No. 10-2009-0029081 (filed on Apr. 3, 2009),which are all hereby incorporated by reference in their entirety.

BACKGROUND OF THE DISCLOSURE

1. Field of the Disclosure

The present invention relates to a metal filling device for a through-via-hole formed in a wafer and a filling method using the same, more particularly, to a device of filling in a through-via-hole of a semiconductor wafer metal melted by pressure difference generated between an upper portion and a lower portion on and under a wafer, to be applicable to a micro through-via-hole having 30 μm or less diameter, and a filling method using the same.

2. Discussion of the Related Art

With a recent trend of light, thin, small and short electronic machines, demands for microminiaturizing a semiconductor package used in an electronic machine haven been increasing.

A two-dimensional arrangement of such the semiconductor package reaches the limit in representing a desired size and capacity. Because of that, three-dimensional package technology enabling semiconductor chips multi-layered three-dimensionally gains attention.

The 3D package technology has to represent various functions, with a light and small size, to enable a high-technology semiconductor such as a memory requiring a high capacity and low electricity or SOC (System On Chip) with high performance. This may be solved by multi-layering thin semiconductor chips and these chips are electrically connected through via-holes, instead of wire-bonding conventionally used in the prior art, to be multi-layered. Advantages of such the 3D package may be a size and weight reduction, improvement of electrical performance, improvement of device performance per unit area and reduction of production cost.

Based on these advantages, a new 3D package technology has been under development and both of the size of the via-hole and the thickness of the wafer have been getting smaller to enable new and various functions. According to ITRS 2007 report, it is predicted that the thickness of the wafer will be 80 μm or less and that a diameter of the via-hole will be 5 μm or less.

However, open Korean Patent number 10-2008-0068334 of which application number is 10-2007-005948 discloses a method of filling in a via-hole Tin or solder melted after electroplating Tin or solder on an inner wall of a via-hole. This is for filling metal in the via-hole having a closed bottom, not a through-via-hole, and it uses an electroplating method and reflow method. Here, the electroplating method may have a big different result according to composition of electroplating solution, the kind of additive, current density, a current mode. Because of that, it is difficult to acquire an optimum work condition. Moreover, that application uses a pressure applying method, a solder ball melting method and a screen printing method. According to the pressure applying method, pressure is applied to molten material after a semiconductor chip having a via-hole formed therein is charged in Tin or molten Tin and a melted Tin or solder is filled in the via-hole. According to the solder ball melting method, a tin or solder ball or like placed on a top of a via-hole is dissolved to be filled in the via-hole. According to the screen printing method, Tin or solder paste is filled in a via-hole in screen-printing only to be melted. However, these methods would generate disadvantages of failing to fill Tin or solder in edge portions of the via-hole.

SUMMARY OF THE DISCLOSURE

Accordingly, the present invention is directed to a device of filling metal in a semiconductor wafer through-via-hole and a filling method using the same that substantially obviate one or more problems due to limitations and disadvantages of the related art.

An object of the present invention is to provide a device of filling metal in a semiconductor wafer through-via-hole and a filling method using the same, which has a simple and easy filling process enough to reduce an assembly cost in comparison to a conventional electroplating method.

Another object of the present invention is to provide a device of filling metal in a semiconductor wafer through-via-hole and a filling method using the same, which can maximize the density of filling metal filled in the through-via-hole to solve a problem of failing to plate a bottom portion of a via-hole according to the conventional electroplating method and to improve electrical conductivity and mechanical characteristics.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a device of filling metal in a through-via-hole formed in a semiconductor wafer includes a jig base comprising a jig configured to fix the wafer having the through-via-hole formed therein; a upper chamber 120 installed on the jig base; a lower chamber installed under the jig base; a heater installed in the upper chamber, the heater configured to apply heat to filling metal placed on the wafer to melt the filling metal; and a vacuum pump configured to generate pressure difference between the upper chamber and the lower chamber by the pressure of the lower chamber reduced by discharging air of the lower chamber 130 outside, only to fill the melted filling metal in the through-via-hole.

The jig may include a wafer seating part configured to seat the wafer thereon; a wafer supporting part integrally formed with a lower end of the wafer seating part in a grid-shape, the grid-shaped wafer supporting part configured to support a lower surface of the wafer without interference with the through-via-hole; and a wafer fixing part assembled to the wafer seating part to fix the wafer seated on the wafer seating part pressingly downward.

The heater may be connected with a hydraulic cylinder installed in the upper chamber, to be movable upward and downward.

In another aspect of the present invention, a method of filling metal in a though-via-hole formed in a semiconductor wafer includes steps of: fixing the wafer having the throughvia-hole formed therein between a upper chamber and a lower chamber; placing metal desired to be filled on the wafer fixed by the step of fixing the wafer; enclosing the upper chamber to prevent air from coming into and out of the upper chamber; heating and melting the metal by using a heater provided in the upper chamber; and filling in the through-via-hole the filling metal melted by the pressure difference between the upper chamber and the lower chamber generated by the reduced pressure of the lower chamber caused by air inside the lower chamber discharged by the vacuum pump.

The step of placing the metal desired to be filled on the fixed wafer may place the metal desired to be filled of one of solder ball type, a paste type or a coated type using a dry-deposition method.

According to the present invention, an inside of a through-via-hole having a micro-diameter in comparison to the conventional electroplating method may be filled at a high density. As a result, the quality of a semiconductor package may be improved. Moreover, the high density filling of the filling metal is implemented. As a result, it is possible to improve electrical conductivity and mechanical characteristics. In addition, a device function per unit area may be enhanced.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 1:
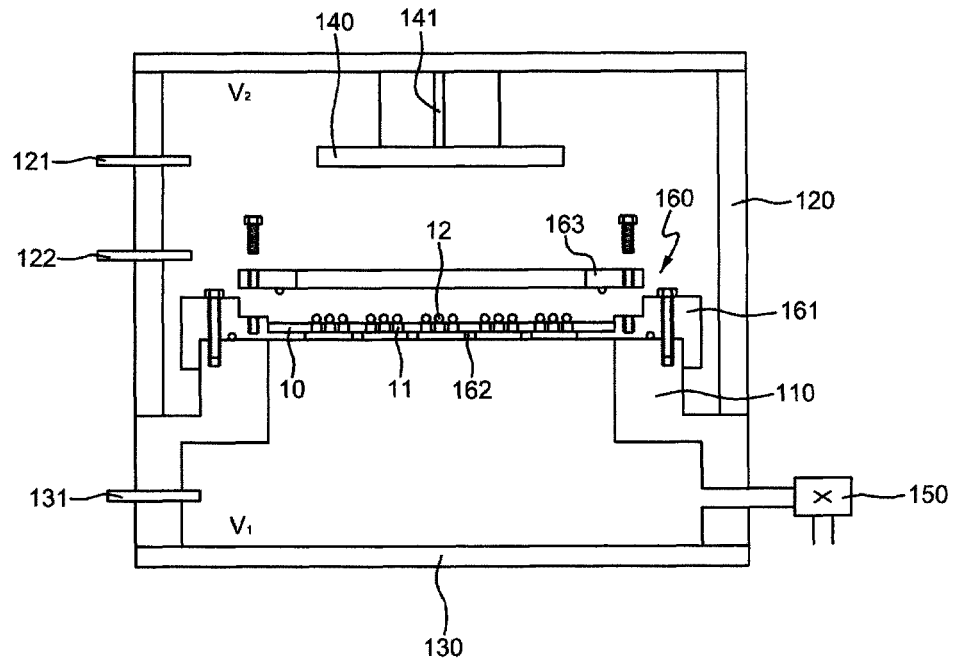
FIG. 1 is a diagram illustrating a structure of a filling device according to an exemplary embodiment of the present invention.

FIG. 1 is a diagram illustrating a structure of a filling device according to an exemplary embodiment of the present invention.

The filling device according to the exemplary embodiment of the present invention places a filling metal 12 on a through-via hole 11 formed in a wafer 10 and it applies heat to the filling metal to melt the metal. After that, the filling device forms a vacuum status under the wafer 10 to suck the metal melted by pressure difference between a top portion above the wafer and bottom portion under the wafer into the through-via-hole to implement filling. The filling device according to the exemplary embodiment of the present invention includes a jig base 110, an upper chamber 120, a lower chamber 130, a heater 140 and a vacuum pump 150.

Figure 2:
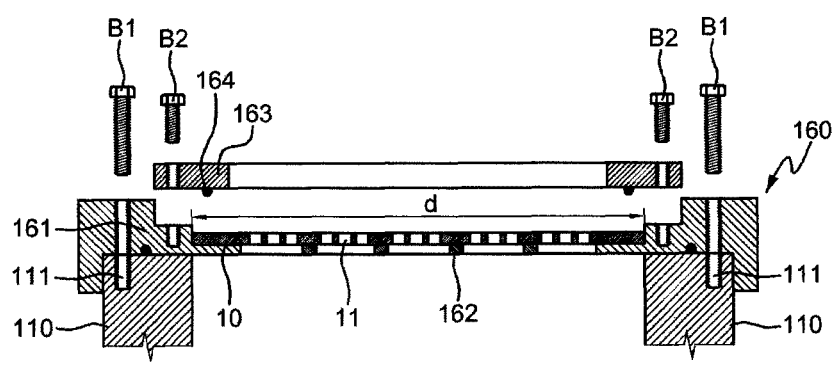
FIG. 2 is a sectional view illustrating a jig base and a jig according to the present invention.
Figure 3:
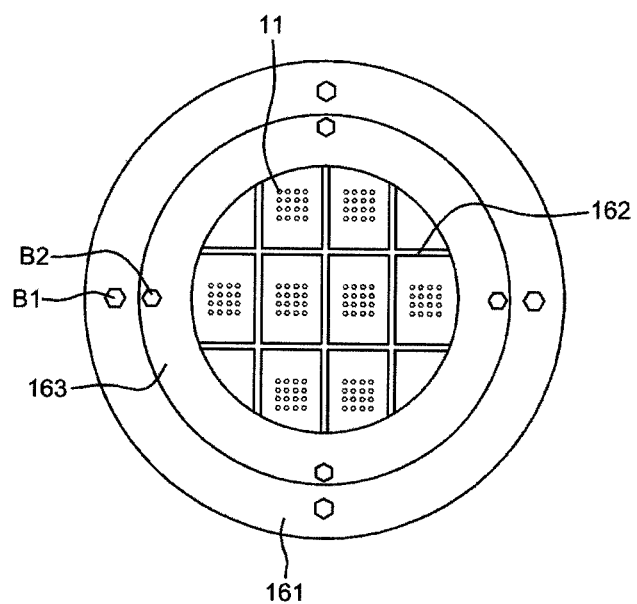
FIG. 3 is a plane view illustrating the jig according to the present invention.

FIG. 2 is a sectional view illustrating a jig base and a jig according to the present invention and FIG. 3 is a plane view illustrating the jig according to the present invention.

The jig base 110 fixes a jig 160 configured to fix the wafer 10 and it may be configured to be assembled and disassembled with and from various kinds of jigs 160 fabricated according to the sizes of the wafers. To enable the assembly and disassembly of the jigs 160, the jig base 110 includes a securing groove 111 formed in a top thereof and a bolt (B1) is secured to the securing groove 111 to secure the jig 160 to the jig base 110.

The jig 160 is configured to fix the wafer 10 having the through-via-hole 11 formed therein and it includes a wafer seating part 161, a wafer supporting part 162 and a wafer fixing part 163.

At this time, the wafer seating part 161 is formed to support an edge of the wafer from a downward to upward direction and an inner diameter (d) of the wafer seating part 161 is fabricated based on the size of the wafer.

The wafer supporting part 162 having a grid-shape is integrally formed with a lower portion of the wafer seating part 161 to support a bottom surface of the wafer such that the thin wafer may be prevented from bending.

To prevent the wafer supporting part 162 from the through-via-hole 11 when the grid-shaped wafer supporting part 162 supports the bottom surface of the wafer 10, it is preferable that the grid-shaped wafer supporting part 162 supports a predetermined portion of the wafer in which the through-via-hole 11 is not formed.

The wafer fixing part 163 pressingly fixes the top of the wafer 10 placed on the wafer seating part 161 to prevent the wafer 10 from moving during the filling process. Such the wafer fixing part 163 may be configured to be ring-shaped to press an edge of the wafer 10 downwardly. In case that the wafer 10 is fixed by way of the wafer fixing part 163, the wafer is seated on the wafer seating part and then the wafer fixing part 163 is secured to the wafer seating part 161 by an auxiliary bolt (B2) to fix the wafer.

In the meanwhile, an o-ring 164 is installed in a lower surface of the wafer fixing part 163 to keep gas tight between the wafer fixing part 163 and the wafer.

In reference to FIG. 1 again, the upper chamber 120 is installed on the jig base 110 to form enclosed space. Such the upper chamber 120 has to be configured to have a closable structure capable of forming a predetermined space to put the wafer 10 on the jig 160 or to take out the wafer after completing the filling process. For that, a predetermined side of the upper chamber 120 may be hingedly connected with an upper end of the jig base 110 to be rotatable in order to be a closable structure. Alternatively, the upper chamber 120 may be integrally formed with the jig base 110 and an auxiliary door is installed in the upper chamber 120 to have the closable structure.

The lower chamber 130 is installed under the jig base 110 configured to form enclosed space. Since it does not require a closable structure, the lower chamber 130 may be fixedly installed under the jig base 110.

The upper chamber 120 and the lower chamber 130 may be integrally formed.

The heater 140 is installed in the upper chamber 120 to supply heat required to melt metal to be filled. The heater 140 may be configured to be an electric heater including a heat wire to generate heat by using electricity.

In the meanwhile, the heater 140 may be configured to move upward and downward to apply heat to the filling metal placed on the wafer in a close distance. As a result, when the heater 140 is installed in the upper chamber, an auxiliary hydraulic cylinder 141 may be installed in the upper chamber 120 and the hydraulic cylinder 141 may be connected with the heater 140 to enable the heat to move upward and downward.

The vacuum pump 150 is configured to discharge air inside the lower chamber 130 outside to make the inside of the lower chamber 130 vacuum to reduce a pressure. Because of that, the pressure difference between the upper chamber 120 and the lower chamber 130 is generated to fill the metal melted by the heater in the through-via-hole.

A well-known vacuum gage 121 configured to measure pressures and a well-known thermo couple 122 configured to measure temperatures may be installed in the upper chamber 120. A well-known vacuum gage 131 configured to measure pressures may be installed in the lower chamber 130.

As follows, a method of filling the metal 12 in the though-via-hole 11 formed in the wafer 10 which uses the filling device having the above configuration will be described.

The filling method with respect to the through-via-hole formed in the semiconductor wafer includes steps of: fixing the wafer 10 having the through-via-hole 11 formed therein between the upper chamber 120 and the lower chamber 130 (S1); placing metal 12 desired to be filled on the wafer fixed by the step of S1 (S2); enclosing the upper chamber 120 to prevent air from coming into and out of the upper chamber 120 (S3); heating and melting the metal by using the heater 140 provided in the upper chamber 120 (S4); and filling in the through-via-hole the filling metal melted by the pressure difference between the upper chamber 120 and the lower chamber 130 generated by the reduced pressure of the lower chamber caused by air inside the lower chamber 130 discharged by the vacuum pump 150 (S5).

S1 is a step of seating the silicon wafer 10 having the through-via-hole 11 formed therein on the jig 160. That is, the wafer in which the through-via-hole is formed is placed on the jig 160.

S2 is a step of placing the metal which will be filled on the wafer fixed to the jig 160. The metal (e.g. Sn series) of a solder ball, paste or coating type by way of a dry-deposition method, having a low melting point, may be placed on the wafer.

S3 is a step of closing the upper chamber 120 open to deposit the wafer and to locate the filling metal to prevent air and foreign substances from coming into the upper chamber 120 during the filling process.

S4 is a step of moving the heater 140 installed in the upper chamber 120 closely to the filling metal and generating heat by electricity applied to the heater 140, only to melt the filling metal.

S5 is a step of forming the inside of the lower chamber 130 vacuum by using the vacuum pump 150 discharging air of the lower chamber 130 outside. As the air inside the lower chamber 130 is discharged outside, the pressure of the lower chamber 130 may be reduced and this reduced pressure generates the pressure difference between the upper chamber 120 and the lower chamber 130. Here, the pressure difference between the upper chamber and the lower chamber makes the metal melts filled into the through-via-hole.

According to the filling device and the filling method described above, filling metal may be filled in a micro-through-via-hole having the thickness of 100 μm or less and the diameter of 30 μm or less smoothly. As a result, micro-miniaturization of electro parts may be presented.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A device of filling metal in a through-via-hole formed in a semiconductor wafer comprising:
    a jig base comprising a jig configured to fix the wafer having the through-via-hole formed therein;
    an upper chamber installed on the jig base;
    a lower chamber installed under the jig base, wherein the jig base is arranged such that the wafer placed on the jig forms a boundary which substantially separates the upper chamber and the lower chamber;
    a heater installed in the upper chamber, the heater configured to apply heat to filling metal placed on the wafer to melt the filling metal; and
    a vacuum pump configured to discharge air in the lower chamber outside and generate pressure difference between the upper chamber and the lower chamber so that the melted filling metal flows in and fills the through-via-hole by the pressure difference.

2. The device of filling the metal in the though-via-hole of claim 1, wherein the jig comprises,
    a wafer seating part configured to seat the wafer thereon;
    a wafer supporting part integrally formed with a lower end of the wafer seating part in a grid-shape, the grid-shaped wafer supporting part configured to support a lower surface of the wafer without interference with the through-via-hole; and
    a wafer fixing part assembled to the wafer seating part to fix the wafer seated on the wafer seating part pressingly downward.

3. The device of filling the metal in the though-via-hole of claim 1, further comprising a hydraulic cylinder connected to the heater to move the heater upward and downward to adjust a distance between the heater and the wafer placed on the jig.

4. A method of filling metal in a though-via-hole formed in a semiconductor wafer comprising steps of:
    fixing the wafer having the through-via-hole formed therein such that the wafer fixed by the step of fixing the wafer forms a boundary which substantially separates an upper chamber and a lower chamber;
    placing metal desired to be filled on the wafer fixed by the step of fixing the wafer;
    enclosing the upper chamber to prevent air from coming into and out of the upper chamber;
    heating and melting the metal by using a heater provided in the upper chamber; and
    discharging air in the lower chamber outside to generate pressure difference between the upper chamber and the lower chamber so that the metal melted by the heater flows in and fills the through-via-hole by the pressure difference.

5. The method of filling the metal in the through-via-hole formed in the semiconductor wafer of claim 4, wherein the step of placing the metal desired to be filled on the fixed wafer places the metal desired to be filled of one of solder ball type, a paste type or a coated type using a dry-deposition method.

6. The method of claim 4, further comprising adjusting a distance between the heater and the wafer.

* * * * *